(12) United States Patent
Clemens et al.

(10) Patent No.: US 10,436,638 B2
(45) Date of Patent: Oct. 8, 2019

(54) LIGHT RECEIVER HAVING GEIGER-MODE AVALANCHE PHOTODIODES AND METHOD FOR READING OUT

(71) Applicant: SICK AG, Waldkirch (DE)

(72) Inventors: Klaus Clemens, Waldkirch (DE); Gottfried Hug, Waldkirch (DE); Stefan Seitz, Waldkirch (DE)

(73) Assignee: SICK AG, Waldkirch (DE)

(*) Notice: Subject to any disclaimer, the term of this patent is extended or adjusted under 35 U.S.C. 154(b) by 175 days.

(21) Appl. No.: 15/617,398

(22) Filed: Jun. 8, 2017

(65) Prior Publication Data
US 2017/0363467 A1 Dec. 21, 2017

(30) Foreign Application Priority Data
Jun. 17, 2016 (EP) .................................. 16175013

(51) Int. Cl.
*G01J 1/46* (2006.01)
*H01L 27/144* (2006.01)
(Continued)

(52) U.S. Cl.
CPC . *G01J 1/46* (2013.01); *G01J 1/44* (2013.01); *H01L 27/1446* (2013.01);
(Continued)

(58) Field of Classification Search
CPC .......... G01J 1/46; G01J 1/44; G01J 2001/448; G01J 2001/442; G01J 2001/446;
(Continued)

(56) References Cited

U.S. PATENT DOCUMENTS 8,395,127 B1 * 3/2013 Frach .................... G01T 1/2018
250/370.08
2006/0202129 A1 9/2006 Niclass et al.
(Continued)

FOREIGN PATENT DOCUMENTS

DE  10 2009 043 746 A1  3/2011
EP   2 720 012 A2       4/2014
(Continued)

OTHER PUBLICATIONS

European Search Report dated Dec. 8, 2016 issued in corresponding European Application No. 16175013.8.
(Continued)

*Primary Examiner* — Georgia Y Epps
*Assistant Examiner* — Jennifer D Bennett
(74) *Attorney, Agent, or Firm* — Nath, Goldberg & Meyer; Jerald L. Meyer; Stanley N. Protigal (57) ABSTRACT

A light receiver (50) is provided having a plurality of avalanche photodiode elements (10) that are each biased by a bias above a breakdown voltage and that are thus operated in a Geiger mode to trigger a Geiger current on light reception. The avalanche photodiode elements (10) have a first connector (20, 22, 28a-b) and a second connector (20, 22, 28a-b). A first signal tapping circuit (12) for reading out the avalanche photodiode elements is connected to one of the connectors (20, 22, 28a-b). In this respect, a second signal tapping circuit (12) for reading out the avalanche photodiode elements (10) is connected to the other connector (20, 22, 28a-b).

17 Claims, 10 Drawing Sheets

(51) Int. Cl.
*H01L 31/02* (2006.01)
*G01J 1/44* (2006.01)

(52) U.S. Cl.
CPC .. *H01L 31/02027* (2013.01); *G01J 2001/442* (2013.01); *G01J 2001/448* (2013.01); *G01J 2001/4466* (2013.01)

(58) Field of Classification Search
CPC ....... G01J 2001/4466; H01L 31/02027; H01L 27/1446; H01L 31/107
See application file for complete search history.

(56) References Cited

U.S. PATENT DOCUMENTS

| | | | | |
|---|---|---|---|---|
| 2012/0249998 A1* | 10/2012 | Eisele | .................... | G01C 3/08 356/5.01 |
| 2013/0099100 A1* | 4/2013 | Pavlov | ................ | H01L 31/107 250/208.2 |
| 2013/0270666 A1* | 10/2013 | Sato | .................... | H01L 27/1446 257/438 |
| 2013/0313414 A1* | 11/2013 | Pavlov | ................ | H01L 31/0224 250/214.1 |
| 2014/0097329 A1* | 4/2014 | Wadsworth | ............... | G01J 1/46 250/208.1 |
| 2015/0340390 A1* | 11/2015 | Wall | .................... | H01L 27/1446 257/438 |
| 2017/0242136 A1* | 8/2017 | O'Neill | ................... | G01T 1/248 |

FOREIGN PATENT DOCUMENTS

| | | |
|---|---|---|
| GB | 2484964 A | 5/2012 |
| WO | 2011/117309 A2 | 9/2001 |

OTHER PUBLICATIONS

Woodring, et al., "Multiplexed avalance photodiode arrays for radiation imaging", Proc. of SPIE, vol. 4784, pp. 199-207, 2002.

\* cited by examiner

LIGHT RECEIVER HAVING GEIGER-MODE AVALANCHE PHOTODIODES AND METHOD FOR READING OUT

FIELD

The invention relates to a light receiver having a plurality of avalanche photodiode elements that are operated in a Geiger mode and to a method for reading out.

BACKGROUND

A light receiver has the function of generating an electrical signal from incident received light. The detection sensitivity of simple photodiodes is not sufficient in a number of application cases. In an avalanche photodiode (APD), the incident light triggers a controlled avalanche effect. The charge carriers generated by incident photons are thus multiplied and a photocurrent is produced that is proportional to the received light intensity, but that is in this respect substantially larger than with a simple PIN diode. In the so-called Geiger mode, the avalanche photodiode is biased above the breakdown voltage such that a single charge carrier released by a single photon can already trigger an avalanche that then recruits all the available charger carriers due to the high field strength. The avalanche photodiode thus, like the eponymous Geiger counter, counts individual events. Geiger-mode avalanche photodiodes are also called SPADs (single photon avalanche diodes).

The high radiation sensitivity of SPADs is utilized in a number of applications. They include medical engineering with CT, MRT or blood analyses, optical metrology including spectroscopy, distance measurement and three-dimensional imaging, radiation detection in nuclear physics or uses in telescopes for astrophysics.

Geiger-mode APDs or SPADs are therefore very fast, highly sensitive photodiodes based on semiconductors. A disadvantage of the high sensitivity is that not only a useful light photon, but also a weak interference event due to external light, optical crosstalk or dark noise can trigger the avalanche effect. This interference event then contributes to the measurement result with the same relatively strong signal like the received useful light and can also not be distinguished therefrom out of the signal. The avalanche photodiode subsequently remains insensitive for a dead time of approximately 5 to 100 ns and is down for further measurements for this time. It is therefore customary to interconnect a plurality of SPADs and to evaluate them statistically.

To be able to actually use the electrical signal, it must be read out of or tapped from the SPAD detector element. Conventional signal tapping circuits are, however, slow and can therefore not cope with high frequency signals. In addition, the signals of the SPADs are simply combined in many known applications. It is, however, not possible therewith to associate the signals with the triggering SPADs, for example in a matrix image sensor.

WO 2011/117309 A2 proposes providing a third electrode at the SPAD detector, in addition to the anode and the cathode for the application of the bias, via which third electrode the Geiger current can be capacitively decoupled. It should thereby be prevented that the reading out is delayed by switching elements of the bias. The document does not, however, look at the actual signal tapping.

SUMMARY

It is therefore the object of the invention to improve the reading out of a plurality of avalanche photodiodes.

This object is satisfied by a light receiver having a plurality of avalanche photodiode elements that are each biased by a bias above a breakdown voltage and that are thus operated in a Geiger mode to trigger a Geiger current on light reception, wherein the avalanche photodiode elements have a first connector and a second connector; wherein a first signal tapping circuit for reading out the avalanche photodiode elements is connected to one of the first and second connectors, and wherein a second signal tapping circuit for reading out the avalanche photodiode elements is connected to the other one of the first and second connectors.

The object is also satisfied by a method for reading out avalanche photodiode elements that are each biased by a bias above a breakdown voltage and are thus operated in a Geiger mode, wherein the avalanche photodiode elements trigger a Geiger current on light reception; wherein the avalanche photodiodes are read out by a first signal tapping circuit that is connected to a first connector of the avalanche photodiode elements; and wherein the avalanche photodiode elements are also read out by a second signal tapping circuit that is connected to a second connector of the avalanche photodiode elements.

The avalanche photodiode elements each have a first connection and a second connection. The invention now starts from the basic idea of reading out the avalanche photodiode elements twice. For this purpose, two signal tapping circuits are connected to a respective one of the connectors so that the information of the avalanche photodiode element is then available in two signals. The avalanche photodiode elements are therefore not only read out once, but twice, with the repeat reading out of the second signal tapping circuit being able to take place in parallel and simultaneously with the reading out of the first signal tapping circuit.

The invention first has the advantages of a light receiver having avalanche photodiode elements, namely, for example, their high sensitivity up to the detection of single photons and the high inherent amplification. Additional information can furthermore be acquired by the double signal tapping. The possibility is inter alia thereby provided of determining which avalanche photodiode element or which group has respectively triggered a detection signal without a separate signal tapping circuit being required for each avalanche photodiode element having a correspondingly complex interconnection and a high space consumption.

The first signal tapping circuit and/or the second signal tapping circuit preferably has/have an active coupling element having an input that is connected to one of the connectors and having an output, wherein the coupling element maps a Geiger current of the respective avalanche photodiode element at the input onto a measurement current corresponding in progression and level to the Geiger current in that the input for the Geiger current forms a virtual short circuit against a potential and the output is decoupled from the input. The signal tapping accordingly utilizes an active decoupling process that is highly sensitive and very fast in this respect. The avalanche photodiode element is in this respect practically short circuited from an AC voltage aspect so that only small voltage changes occur between the connectors on a triggering of the avalanche so that parasitic capacitances of the avalanche photodiode elements are hardly transferred and thus only have a slight effect on the output signal quality and on the bandwidth.

Such an active signal tapping is very particularly advantageous for the invention and should therefore be explained still further. The Geiger-mode avalanche photodiode elements or SPADs practically act as highly light-sensitive switches that trigger a Geiger current through the incidence of light. Conventional forms of signal tapping are not able to reflect the very fast processes on an avalanche effect in the measured signal due to insufficiently optimized circuits. The active coupling element is therefore provided and not only passive elements such as a resistor or a transformer. The active coupling element provides a virtual short circuit against a preferably fixed potential for the Geiger current at its input. This will practically only be successful down to a few ohms or to fractions of an ohm. However, it means that the Geiger current flows almost completely from the detector, that is from the respective triggering avalanche photodiode element, into the respective signal tapping circuit and can flow off via the short circuit in a very different manner than with a simple measurement resistance, for example. The parasitic capacitance formed by the plurality of avalanche photodiode elements can therefore no longer act as a low pass and charge transfer procedure practically no longer occur. The fast high frequency Geiger current can flow off substantially without impediment to the amplifying element. The coupling element furthermore actively generates a measurement current at its output that corresponds to the Geiger current and thus in particular shows the same temporal progression. The active coupling element can additionally provide through an amplification that the measurement current has a level suitable for the further processing. The measurement current is simultaneously almost completely decoupled from the Geiger current by the active coupling element. The further processing of the measurement current therefore does not retroact on the Geiger current. Since the current available with the detection event can flow practically completely into the active coupling element, an ideal amplification results with a very good signal-to-noise ratio.

The progression of the measurement current preferably only differs substantially from the Geiger current due to frequency-induced losses thanks to the active coupling element for changes in the higher Gigahertz range, in particular above two or three GHz. The mapping of the Geiger current onto the measurement current only shows highly noticeable frequency-induced losses for frequencies of the incident light signal above some GHz. In contrast to this, the measurement signal already falls by a plurality of decades at middle frequencies of some hundred MHz in conventional solutions. It thus becomes possible with the active coupling element also to trigger very brief pulses and flanks in the sub-nanosecond range.

The first connector is preferably arranged on the anode side and the second connector is preferably arranged on the cathode side of the respective avalanche photodiode element. The two taps thus have particularly low interference. The Geiger current is, for example, not split, for instance, but rather the full measurement signal is respectively available. Due to the tapping at both sides of the avalanche photodiode element, the two signals are inverse to one another, which can, however, be compensated without problem by analog circuit elements arranged downstream or by digital processing.

The avalanche photodiode elements are preferably biased via the first connector and the second connector. The bias is thus provided from which the avalanche effect is fed. Connectors are then used for the tapping that are anyway present, which simplifies the design of the individual avalanche photodiode elements.

A charge unit is preferably respectively provided between the avalanche photodiode element and the first connector or the second connector and the charge unit is bridged by a capacitor connected in parallel. The charge unit is frequently a charge resistor, but can also be a power source and determines the charging procedure after an avalanche effect. The capacitor serves as an AC current bridge so that the high frequency portions of the Geiger current can be tapped without problem.

The avalanche photodiode elements preferably have a third connector, with the first connector being configured for the capacitive decoupling of the Geiger current and the avalanche photodiode elements being biased via the second connector and the third connector. The first connector here only serves for the fast capacitive signal tapping. An additional third connector is provided so that the avalanche photodiode elements are biased via the second and third connectors. The reading out is simplified by the first connector independent of the provision of the bias.

The avalanche photodiode elements preferably have a third connector and a fourth connector and a first charge unit is respective arranged between the avalanche photodiode element and the third connector and a second charge unit is arranged between the avalanche photodiode element and the fourth connector, wherein in particular the avalanche photodiode elements are biased via the third connector an the fourth connector. The charge unit is here split into a first and second charge unit, preferably symmetrically. Two signals that are in particular of the same type, in particular with comparable damping values and latencies, are thereby tapped. The connectors for the bias and the signal tapping are separate from one another.

The first charge unit is preferably bridged to the first connector using a first capacitor connected in parallel and the second charge unit is bridged to the second connector using a second capacitor connected in parallel. The capacitors serve as in the embodiment having only two connectors overall as AC current bridges to tap the Geiger current without interference.

The avalanche photodiode elements preferably form a matrix arrangement, wherein a plurality of first signal tapping circuits are each connected to the first connectors of the avalanche photodiode elements of a column and a plurality of second signal tapping circuits are respectively connected to the second connectors of the avalanche photodiode elements of a row. So many first signal tapping circuits are thus preferably accordingly present as columns and thus as many second signal tapping circuits as rows. The avalanche photodiode elements of a column are connected via their first connectors and a column line to the responsible first signal tapping circuit; the avalanche photodiode elements of a row are correspondingly connected via their second connectors and a row line to the responsible second signal tapping circuit. In this respect, the roles of the first and second signal tapping circuits, first connectors and second connectors as well as rows and columns are only interchangeable names. The technical advantage is that the avalanche photodiode elements are connected twice in a systematic manner and a spatial association of a detection event thereover can take place to an avalanche photodiode element in the matrix. The light receiver thus becomes spatially resolving.

The avalanche photodiode elements preferably form a linear arrangement divisible into groups, wherein a plurality of first signal tapping circuits are each connected to the first connectors of the avalanche photodiode elements of a group and a plurality of second signal tapping circuits are each connected to the second connectors of an avalanche photodiode element from each group. This is an example for the fact that avalanche photodiode elements can also be grouped differently than in rows and columns and a spatial assignment of a detection event is then made possible by the double signal tapping. In this example, n groups are preferably each formed with the same number of m avalanche photodiode elements in a linear arrangement. There are then n first signal tapping circuits, one for each group, and m second signal tapping circuits that are each connected to an avalanche photodiode element of each group. In other words, the circuit topology here corresponds to a matrix with rows and columns, but the geometry of the avalanche photodiode elements is preferably linear. The double signal tapping can be adapted in a similar manner to further circuit topologies and arrangements of the avalanche photodiode elements.

Avalanche photodiode elements are preferably connected in parallel and generate a common signal. A plurality of avalanche photodiodes therefore form a group, for example a pixel of a matrix arrangement. This preferably takes place in a systematic manner, for instance in that all the avalanche photodiode elements are divided into groups of equal size. Each signal is then based on the detection of a plurality of avalanche photodiode elements, whereby effects typical of SPADs such as the dead time after a detection event or a false triggering by an interference event are statistically alleviated.

In an advantageous further development, an optoelectronic sensor has at least one light receiver in accordance with the invention. The distance can be determined by triangulation such as in a triangulation scanner or a stereo camera. The distance measurement preferably takes place using a time of flight process. In a pulse time of flight process, a brief light pulse is transmitted by a light transmitter and the time up to the reception of a remission or reflection of the light pulse is measured. Alternatively, in a phase process, transmitted light is amplitude modulated and a phase shift between the transmitted light and the received light is determined, with the phase shift likewise being a measure for the time off flight. The time of flight process can be used in a one-dimensional distance scanner, a laser scanner or an image sensor of a 3D camera in accordance with the time of flight principle. Further non-exclusive applications of the light receiver in an optoelectronic sensor are code reading or data transfer or combinations of these applications in a sensor.

The method in accordance with the invention can be further developed in a similar manner and shows similar advantages in so doing. Such advantageous features are described in an exemplary, but not exclusive manner in the subordinate claims dependent on the independent claims.

In this respect, an input of an active coupling element for the Geiger in the first signal tapping circuit and/or in the second signal tapping circuit and connected to one of the connectors is virtually short circuited against a potential such that the Geiger current flows into the coupling element practically without change and is mapped there onto a measurement current corresponding to the Geiger current in progression and level at an output of the coupling element, wherein the output is decoupled from the input. The mode of operation and the advantages of this active decoupling were already explained above.

The avalanche photodiode elements advantageously form a matrix arrangement and each avalanche photodiode element is read out, on the one hand, via a first signal tapping circuit associated with its column and, on the other hand, via a second signal tapping circuit associated with its row. This permits a spatially resolving detection.

BRIEF DESCRIPTION OF THE DRAWINGS

The invention will be explained in more detail in the following also with respect to further features and advantages by way of example with reference to embodiments and to the enclosed drawing. The Figures of the drawing show in.

DETAILED DESCRIPTION

Figure 1:
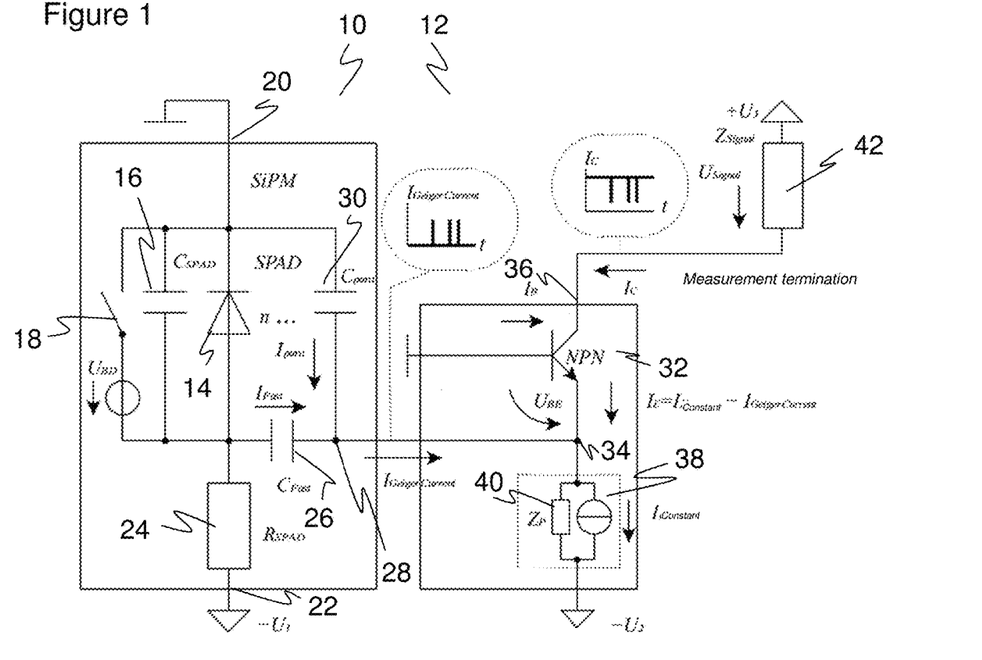
FIG. 1 a representation of a signal tapping circuit for an avalanche photodiode element with an active coupling element.

FIG. 1 shows as a starting point a representation of an avalanche photodiode element 10 having a signal tapping circuit 12 that is optimized for sensitivity and bandwidth. The invention relates to an arrangement of a plurality of such avalanche photodiode elements each having two signal taps that are preferably each configured as in FIG. 1 and will then be explained further below with reference to FIGS. 3 to 11.

The avalanche photodiode element 10 is shown as an equivalent circuit diagram. The actual design of the semiconductor component is considered as known and is not shown. A corresponding component can, for example, be manufactured in a CMOS process. The breakdown voltage of the avalanche photodiode elements 10 is considerably smaller than in conventional avalanche photodiodes and amounts, for example, to at most 50 V or 30 V.

The avalanche photodiode element 10 shows the behavior of a diode 14, on the one hand. It additionally has a capacitance that is represented by the capacitor 16 connected in parallel. An avalanche effect is triggered by at least one incident photon, with this process acting like a switch 18. In standby mode, a voltage above the breakdown voltage is present above the diode 14 between a connector 20 and a connector 22. If then an incident photon generates a charge carrier pair, it so-to-say closes the switch 28 such that the avalanche photodiode element 10 is flooded with charge carriers and a so-called Geiger current flows. New charge carriers, however, only arise as long as the electrical field remains strong enough. If the capacitor 16 is discharged so much that the breakdown voltage is fallen below, the avalanche self-quenches ("passive quenching"). The capacitor 16 is then charged from the connectors 20, 22 via a resistor 24 until a voltage above the breakdown voltage is again applied to the diode 14. There are alternative embodiments in which the avalanche is recognized from outside and a discharge is thereupon triggered below the breakdown voltage.

The output signal rises rapidly and independently of the intensity of the triggering light to a maximum value during the avalanche and then falls again after the quenching of the avalanche. The time constant of the drop that indicates a dead time of the avalanche photodiode element 10 is typically in the range of some nanoseconds up to some tens of nanoseconds. The dead time is not an absolute dead time for, as soon as the bias is large enough to support an avalanche, the output signal can also rise again; however, not to the same degree as from the standby state. The amplification factor amounts to up to $10^6$ and substantially results from the maximum number of charge carriers that can be recruited by the avalanche in the avalanche photodiode element 10.

The function of the signal tapping circuit 12 is to lead off a measurement signal from the Geiger current during an avalanche effect, utilizing the full current flow where possible, and indeed such that high frequency portions are also maintained and a high signal-to-noise ratio is achieved. The signal decoupling preferably takes place capacitively over a coupling capacitor 26. In the embodiment shown, the avalanche photodiode element 10 has its own connector 28 for reading out a measurement signal, with this connector 28 being connected via the coupling capacitor 26. Alternatives to such an avalanche photodiode element 10 will also be presented further below having more or fewer than three connectors 20, 22, 28.

Further avalanche photodiode elements not shown in FIG. 1 form, from the viewpoint of the avalanche photodiode element 10 shown, parasitic capacitances that can be increased by other parasitic effects. The parasitic capacitance 30 is the sum of the typically numerous further avalanche photodiode elements in practical applications and can therefore be much larger than the capacitance of the associated coupling capacitor 26. The parasitic capacitance 30 behaves like a low pass that blocks high frequency signals.

The signal tapping circuit 12 should have a signal resistance that is as small as possible to achieve high speeds or bandwidths and should simultaneously have a large signal resistance for a high sensitivity. To meet these contradictory demands, the signal tapping circuit 12 utilizes an active circuit solution having an active coupling element 32 that is configured as a bipolar NPN transistor in the base circuit in FIG. 1. Other active elements, in particular other transistors (FETs), a different polarity (PNP) or a different circuit (emitter circuit) are conceivable. In addition, a plurality of transistors can also be used instead of a single-stage circuit.

The active coupling element 32 now has a plurality of substantial advantages for the signal tapping. On the one hand, it provides practically no resistance for the Geiger current capacitively decoupled as a current pulse, i.e. it forms a virtual short circuit. This is practically not fully achieved, but less than one ohm is by all means possible. This has the result that there are no relevant voltage changes over the parasitic capacitance 30 despite the avalanche and that there are thus no charge transfer procedures and no current flow. Almost the total Geiger current that flows through the coupling capacitance 26 is therefore available to the active coupling element 32. Without the virtual short circuit, in contrast, considerably appreciable portions of the Geiger current would be lost in the parasitic capacitance 30 and the fast, high frequency signal portions would above all be suppressed.

Secondly, the active coupling element 32 at the output side generates a measurement current whose time progression and level corresponds to the Geiger current. In this respect, the active coupling element 32 can also directly vary, in particular amplify, the measurement current with respect to the Geiger current by its transfer function. Practically the complete current of the avalanche effect is available at the coupling element 32 for this purpose. The measurement current is subsequently tappable at the output side for further processing as the detection result. The measurement current is fed from a power source of the active coupling element 32 and not from the avalanche photodiode element 10.

In this respect, thirdly, the input circuit and the output circuit are decoupled from one another. The further processing of the measurement current therefore has, within the limits of a real decoupling, no effects on the Geiger current. Practically any desired subsequent stages are therefore possible which, unlike conventional signal tappings, have no unfavorable repercussions for the Geiger current.

In the specific example of FIG. 1, the emitter of the active coupling element 32 forms the input 34 to which the Geiger current is supplied by the connector 28 of the avalanche photodiode element 10. The base is connected to ground or generally to a fixed potential and is thus virtually short circuited. The collector forms the output 36 at which the measurement current is provided. There is also a constant power source 39 between the input 34 and a supply voltage $-U_2$ in the emitter circuit of the transistor. A DC current that sets the operating point of the transistor thereby flows at times outside avalanche effects. The constant power source 38 can alternatively be realized passively by a resistor 40 or as a combination of both, as shown in FIG. 1. The measurement current is tapped at the output 36. A simple measurement impedance 42 is only one example of any desired measurement circuits that can have further active and/or passive elements. These measurement circuits practically have no repercussion on the actual measurement due to the decoupling by means of the signal tapping circuit 12.

Figure 2:
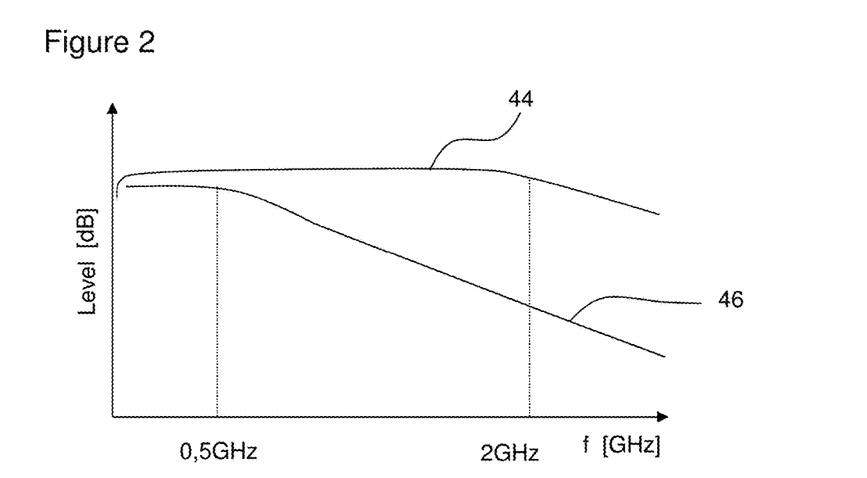
FIG. 2 a comparison of the frequency response of a signal circuit with an active coupling element and a conventional signal tapping circuit.

FIG. 2 illustrates the high frequency behavior of the signal tapping circuit in accordance with FIG. 1 as the result of a test arrangement in which a laser radiates a signal onto a light receiver having a plurality of avalanche photo elements 10, with the laser light being modulated in its amplitude by a varying frequency of 100 kHz to 3 GHz. In this respect, the upper progression 44 corresponds to the result with the signal tapping circuit 12 and the lower progression 46 corresponds, for comparison, to a conventional signal tapping. The signal tapping circuit 12 shows a very flat frequency response with a bandwidth of 2 GHz and a clear signal drop only on the other side of 2 to 3 GHz. This is a multiplication with respect to the lower progression 46 where the measurement signal already breaks down at moderate frequencies long before the GHz range.

Figure 3:
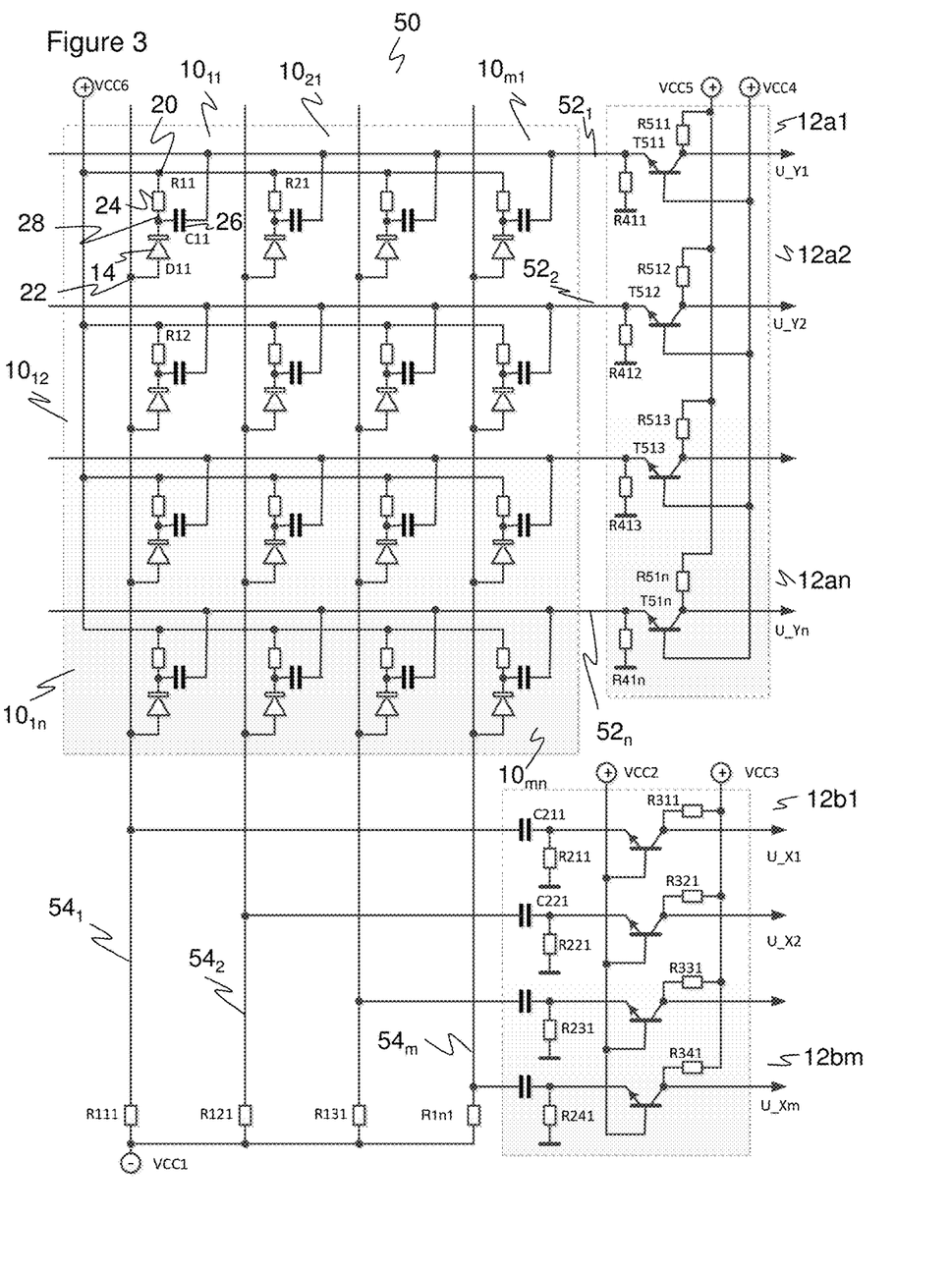
FIG. 3 a schematic circuit arrangement of a matrix of avalanche photodiode elements having three connectors and a respective double signal tapping for the reading out in rows and columns.

FIG. 3 shows a schematic circuit arrangement of a light receiver 50 having a plurality of m×n avalanche photodiode elements $10_{11} \ldots 10_{mn}$ that are arranged in a matrix with m columns and n rows. The individual avalanche photodiode elements $10_{11} \ldots 10_{mn}$ can correspond to FIG. 1 in their design even though they are shown simplified here. In addition, the position of the connector 28 and of the resistor 24 at the diode 14 have been swapped over in FIG. 3 with respect to FIG. 1 to illustrate that their interconnection is possible at the anode side and at the cathode side. The number of avalanche photodiode elements $10_{11} \ldots 10_{mn}$ varies in dependence on the component and on the target demands and can amount to several thousand and more. In this respect, avalanche photodiode elements can also be electrically interconnected group-wise in a different manner than in the illustration. The individual matrix positions are then therefore occupied by a plurality of avalanche photodiode elements that deliver a common sum signal. This enables statistical methods that compensate the fact that an individual Geiger mode avalanche photodiode element can, on the one hand, already be incorrectly triggered by a signal external light photon and can, on the other hand not be activated for some time after each triggering.

The detection signal of the avalanche photodiode elements $10_{11} \ldots 10_{mn}$ is in each case tapped twice at the connector 28 over a respective row line $52_1 \ldots 52_n$ and at signal tapping circuits $12a1 \ldots 12an$ associated with the rows as well as at the connector 22 over a respective column lead $54_1 \ldots 54_m$ and signal tapping circuits $12b1 \ldots 12bm$ associated with the columns. Which avalanche photodiode element $10_{11} \ldots 10_{mn}$ has triggered a detection event can be determined by this type of reading out. The light receiver 50 thus becomes spatially resolving.

The avalanche photodiode elements $10_{11} \ldots 10_{mn}$ are biased over the voltage sources VCC6 and VCC1 and their pre-resistors $R111 \ldots R1n1$. The function of the active coupling elements 32 in the signal tapping circuits $12a1 \ldots 12an, 12b1 \ldots 12bm$ have already been explained in connection with FIG. 1. They ensure an input resistance that is as small as possible and that ensures that the voltages hardly change on an avalanche event. Larger circuit capacitances that are unavoidable with the plurality of interconnected avalanche photodiode elements $10_{11} \ldots 10_{mn}$ thus also have hardly any effect on the received signal because there are practically no charge transfer procedures, because the signal current is available almost completely, and because the signal shows very good high frequency properties.

The bias current of the active coupling element 32 results in the signal tapping circuits $12a1 \ldots 12an$ of the rows from the voltage source VCC4, less $U_{be}$, and from the respective resistor $R411 \ldots R41n$. The voltage source VCC5 supplies the transistor stage. The signal voltage which is a negative pulse that is superposed on a positive DC voltage/bias voltage can be decoupled at the resistor $R511 \ldots R51n$. If the diode D11, for example of the avalanche photodiode element $10_{11}$, now breaks down, a negative current pulse is coupled onto the row signal line via the capacitor C11 and is supplied to the emitter of the transistor T511. $U_{be}$ thus rises and the collector current will increase accordingly. The output signal U_Y1 will output a negative voltage pulse.

The signal tapping circuits $12b1 \ldots 12bm$ of the columns are connected via the anodes of their respective diodes 14 to the column lines $54_1 \ldots 54_m$. On an avalanche effect, a positive current pulse is therefore coupled onto the emitter $T311 \ldots T3m1$ via the coupling capacitors $C211 \ldots C2m1$ and is tapped at the collector or at $R311 \ldots R3m1$. The operating point of the transistors $T311 \ldots T3m1$ is here fixed via VCC2, less $U_{be}$, and via the resistor $R211 \ldots R2m1$ and the supply takes place via VCC3.

Figure 4:
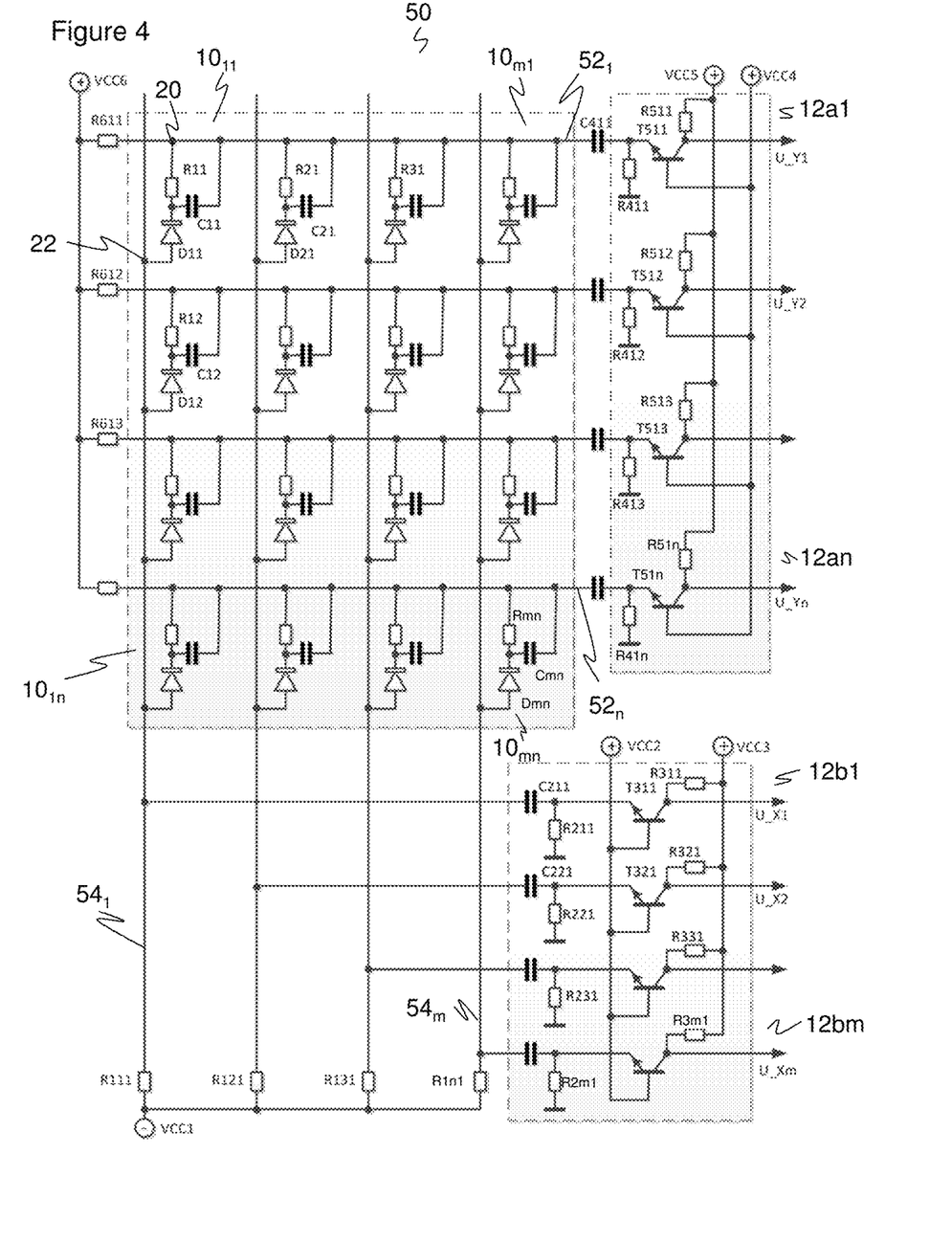
FIG. 4 an alternative embodiment of the circuit arrangement in accordance with FIG. 3 of avalanche photodiode elements having two connectors.

In the embodiment in accordance with FIG. 3, avalanche photodiode elements $10_{11} \ldots 10_{mn}$ are used having three connectors 20, 22, 28. FIG. 4 shows an alternative embodiment having two connectors 20, 22. The signal tapping thus takes place at the connectors via which the bias is also applied. For this purpose, the typically high-ohmic charge resistor $R11 \ldots Rmn$ is bridged in an AC current aspect by a respective small capacitor $C11 \ldots Cmn$ in a parallel branch to conduct fast current pulses on an avalanche effect at low ohms to the signal tapping circuits $12a1 \ldots 12an$, $12b1 \ldots 12bm$. The processes correspond overall to those in the embodiment in accordance with FIG. 3.

Figure 5:
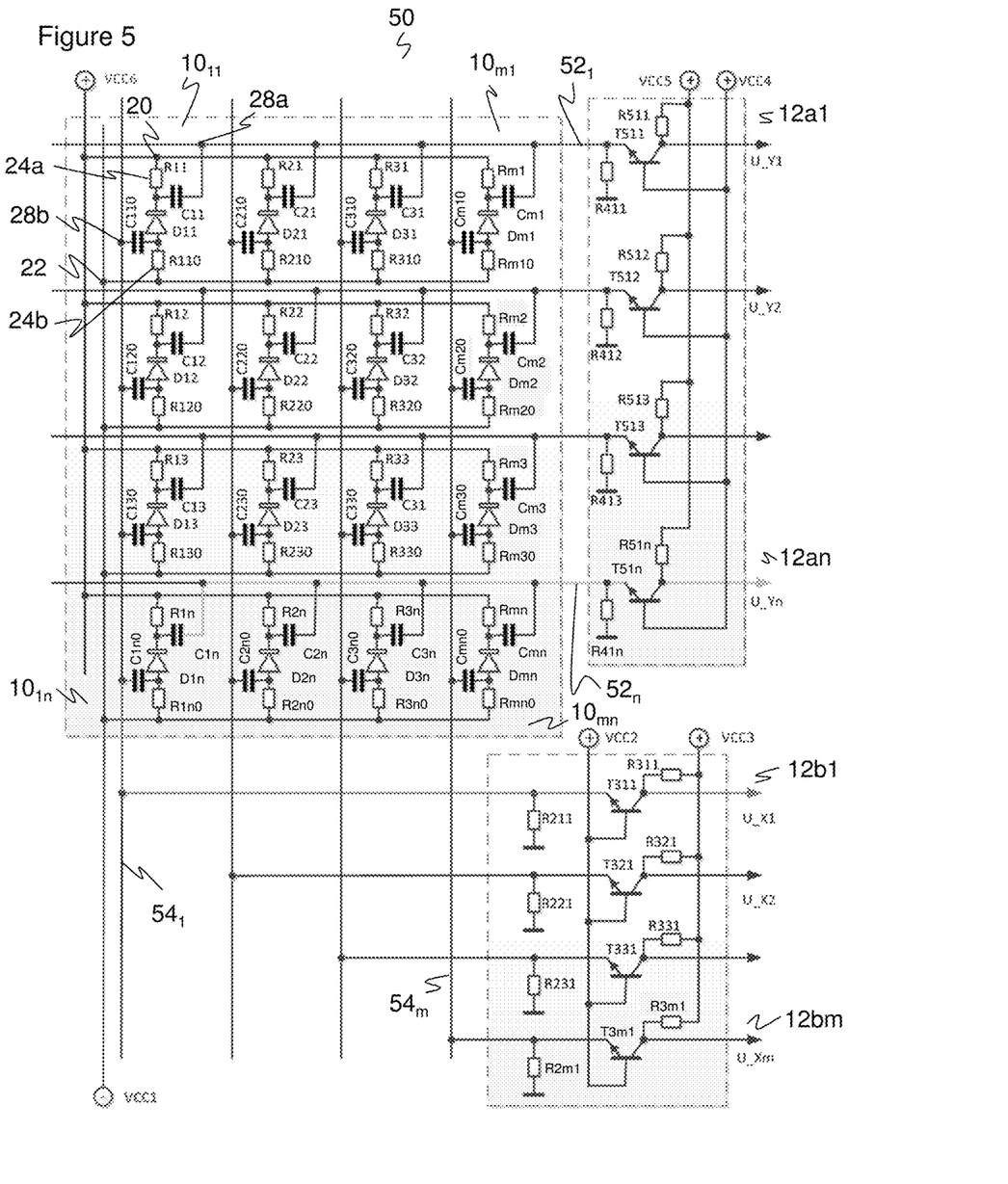
FIG. 5 an alternative embodiment of the circuit arrangement in accordance with FIG. 3 of avalanche photodiode elements having four connectors.

FIG. 5 shows a further alternative embodiment in which the avalanche photodiode elements $10_{11} \ldots 10_{mn}$ have four connectors 20, 22, 28a-b. For this purpose, the charge resistor 24a-b is divided into two portions R11, R110 ... Rmn, Rmn0, in particular by half, that are connected at the cathode or at the anode of the diode $D11 \ldots Dmn$ to supply the bias +VCC6 or –VCC1. The signals are decoupled via a respective capacitor C11, C110 ... Cmn, Cmn0 at the cathode or at the anode. Advantages can particularly result with a symmetrical or 50% division, for example, with respect to time of flight differences that are as small as possible between the row lines $51_1 \ldots 52_n$ and the column lines $51_1 \ldots 54_m$.

Figure 6:
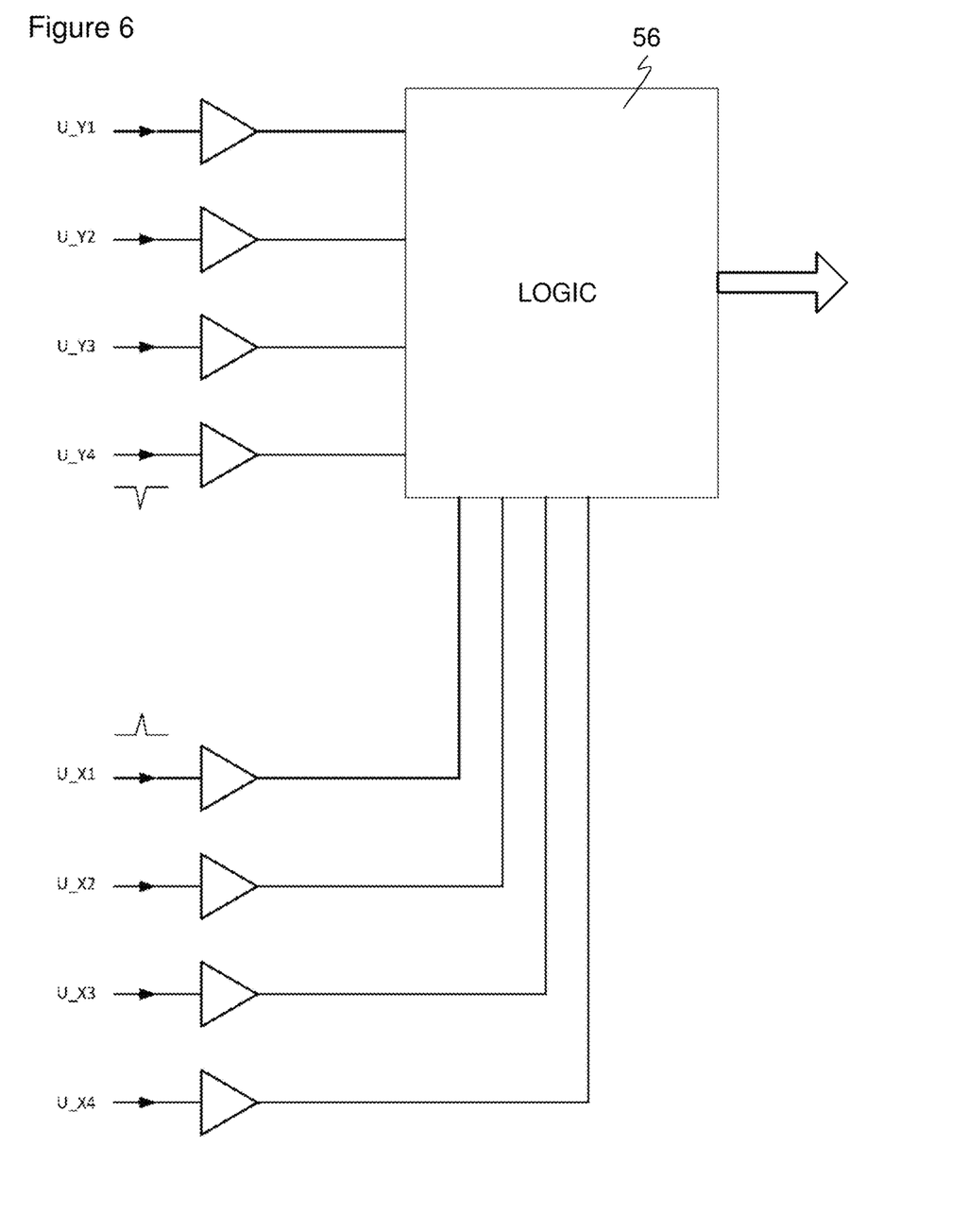
FIG. 6 a block diagram of a logic for associating a detection event to an avalanche photodiode element.

FIG. 6 shows a block diagram of a logic 56 for associating a detection event with an avalanche photodiode element $10_{11} \ldots 10_{mn}$. It is the object of this logic 56 to carry out this association by linking the Y signals with the X signals. In this respect, the input signals can be pre-processed, amplified here by way of example.

Figure 7:
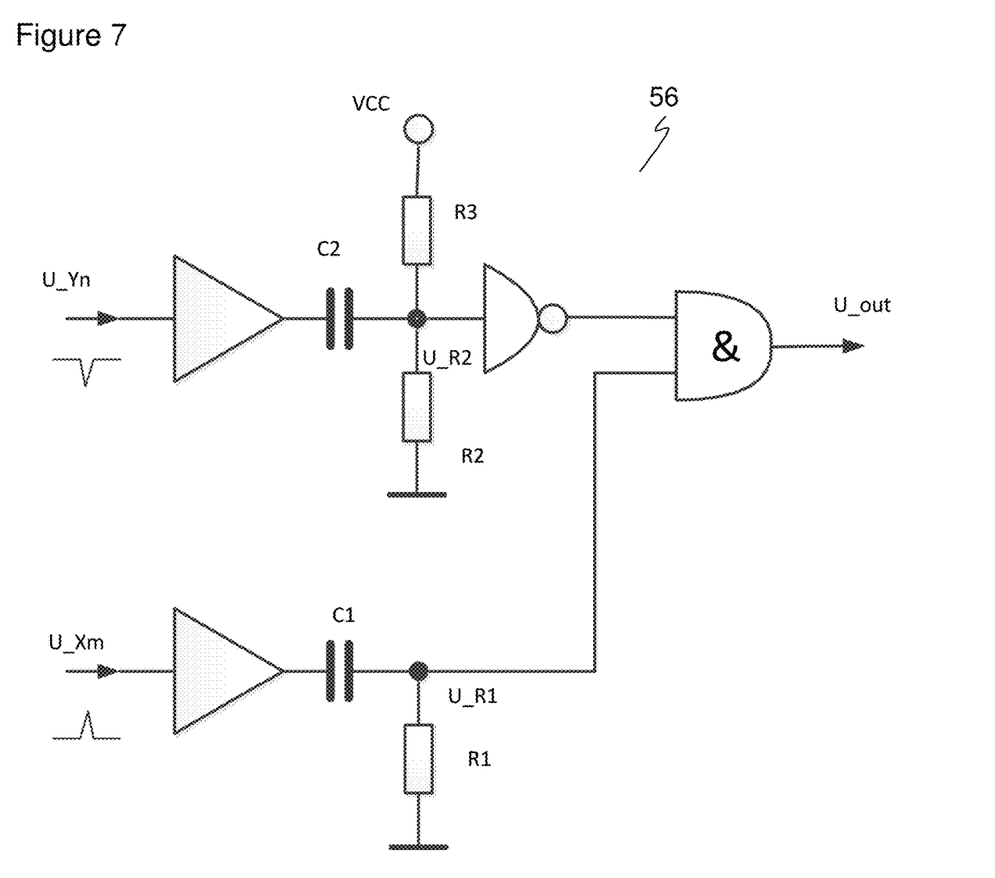
FIG. 7 an exemplary circuit arrangement for the logic in accordance with FIG. 6.

FIG. 7 shows an exemplary simple circuit arrangement for the logic 56. In this respect, the signals $X_m$ and $Y_m$ are linked with one another via an AND logic. In the bias state, a LOW potential is applied to both inputs of the AND logic. This is achieved for the X signal line with a leak resistor R1 to ground in combination with a capacitor C1 connected upstream. Since the input signals on the Y signal line are negative, an inverter is also arranged here. So that a LOW potential is also applied to the input of the AND gate here at bias, the input of the inverter is drawn to a HIGH potential via a voltage splitter. With corresponding adaptations, it is also possible to use an OR gate, a NAND gate or a NOR gate instead of an AND logic.

Figure 8:
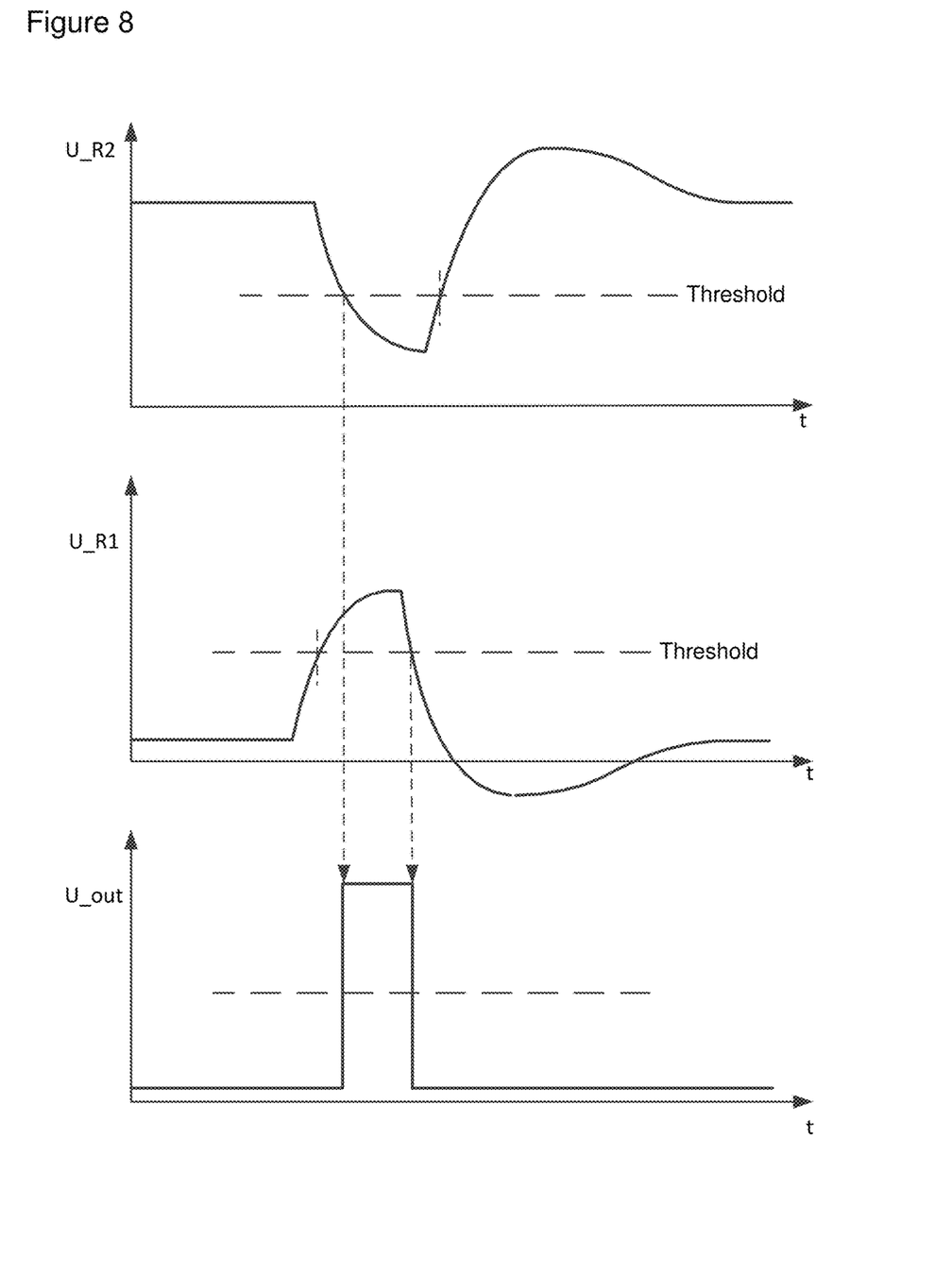
FIG. 8 an exemplary signal progression at different points of the circuit arrangement in accordance with FIG. 7.

FIG. 8 shows exemplary signal progressions at different points of the circuit arrangement in accordance with FIG. 7, namely at the top the voltage U_R2 of the Y signal; in the middle the voltage U_R1 of the X signal, and at the bottom the output voltage U_out. In the bias state, the voltage U_R2 is HIGH and the voltage U_R1 is LOW. The output voltage is HIGH exactly when both U_R2 changes to LOW and U_R1 changes to HIGH. In the example of FIG. 8, the voltage progression U_R2 is somewhat delayed with respect to U_R1 for an exemplary illustration. This has the consequence that the output voltage pulse at U_out is a little shorter than the input pulses. The times of flight of the two signal lines X or Y should generally be very similar or are equal in the ideal case to counteract such a reduction of the pulse width.

Figure 9:
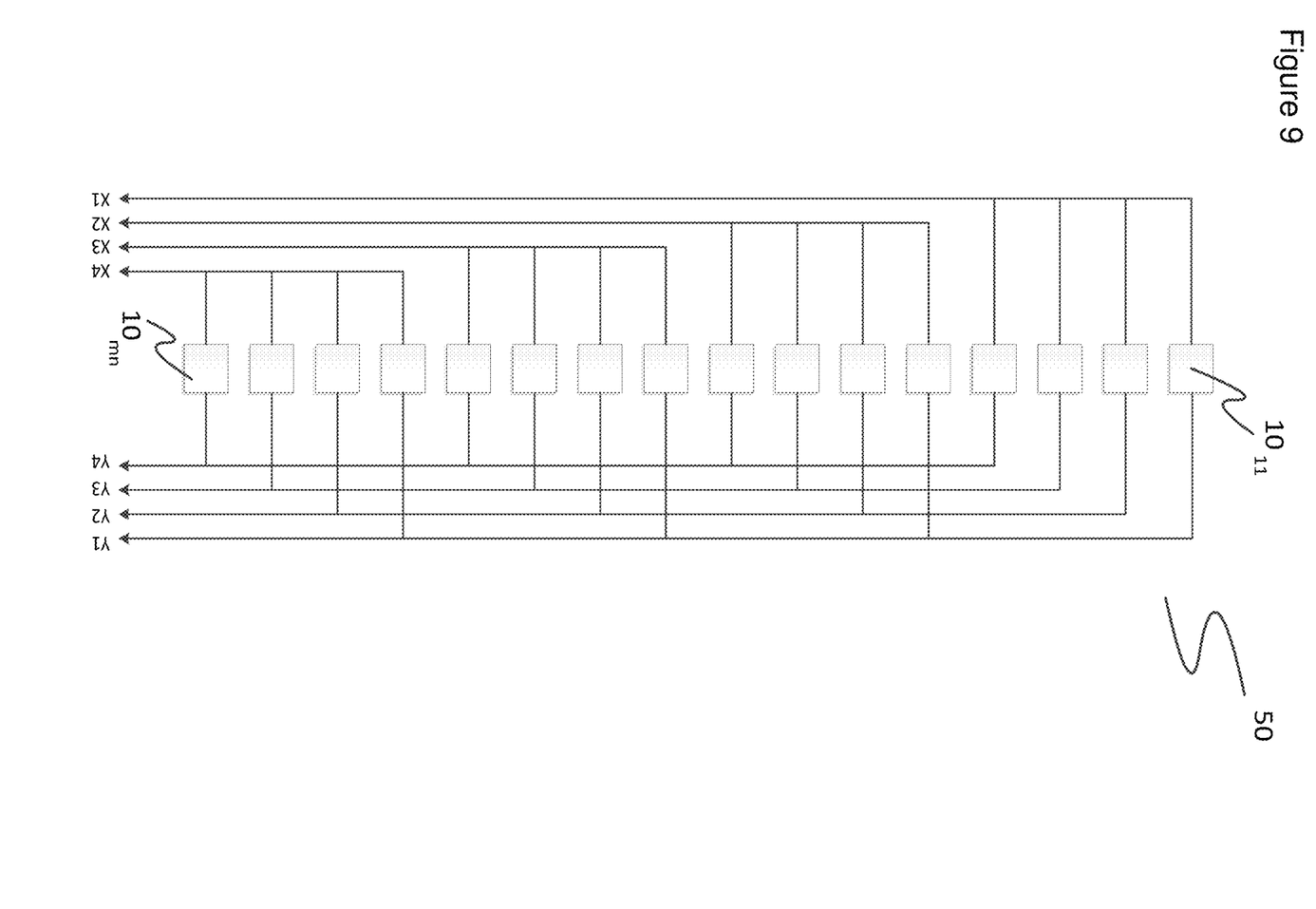
FIG. 9 an alternative linear arrangement of avalanche photodiode elements with a double signal tapping for the spatial association of detection events.

FIG. 9 shows an alternative linear arrangement of avalanche photodiode elements $10_{11} \ldots 10_{mn}$. The double signal tapping also enables a spatial association of detection events here. The first signal tap divides the avalanche photodiode elements $10_{11} \ldots 10_{mn}$ into groups while the second signal tap respectively reads out the ith avalanche photodiode element $10_{11} \ldots 10_{mn}$ of a group. The circuit topology thus basically corresponds to FIGS. 3 to 5 and the variants shown there are also possible. Only the geometrical arrangement of the avalanche photodiode elements $10_{11} \ldots 10_{mn}$ is different. A linear arrangement is only one example. In addition, the circuit topology, that is the association of the two signal taps, can also be varied.

In a matrix arrangement having numerous avalanche photodiode elements $10_{11} \ldots 10_{mn}$ connected in parallel, problems typically occur due to crosstalk effects. The crosstalk is greatly reduced by the particularly low ohmic or virtually short circuited signal tapping circuit 12 because there are only very small voltage changes or signal voltages in the matrix lines. This will be conclusively explained with reference to FIGS. 10 and 11.

Figure 10:
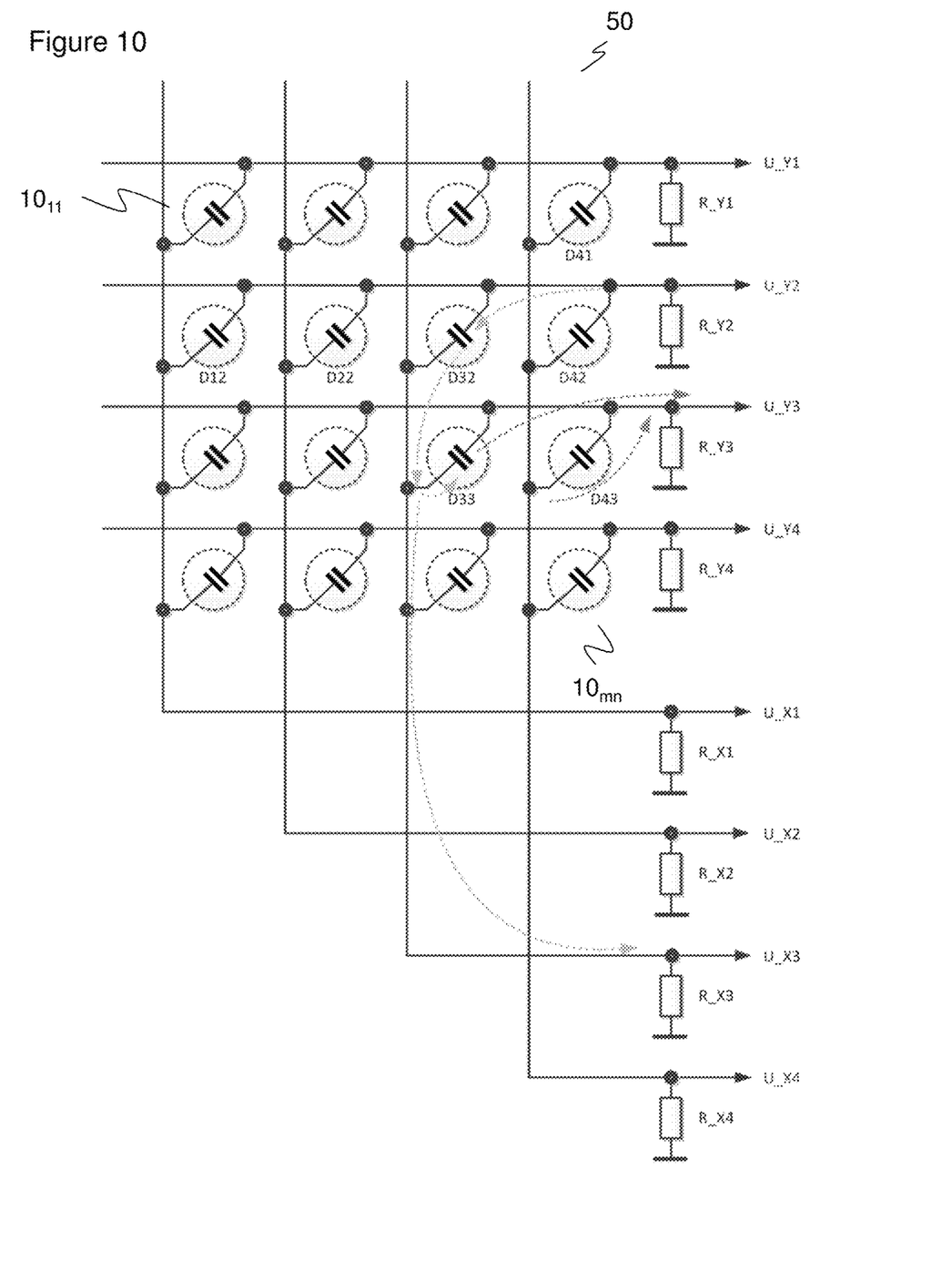
FIG. 10 a matrix representation of avalanche photodiode elements for the explanation of crosstalk effects.

FIG. 10 shows the matrix arrangement of the light receiver 50, with numerous elements being omitted for reasons of clarity, the avalanche photodiode elements being reduced to a number of 4×4, and only being shown as capacitors in accordance with their properties relevant to the crosstalk. If now, for example, D42 triggers, the measurement signal has to be measured at U_Y2 and in the opposite polarity at U_X4. R_Y and R_X represent the differential input resistances of the signal tapping circuits. If now R_Y2 is not very low ohm, a specific coupling of U_Y2 to U_X3 will occur over the row D32. Signal portions are consequently coupled to U_X1 and U_X2 over the corresponding cells D12 and D22. It must be noted in this respect that the polarity of the crosstalk signals is opposite to U_X4. Signal portions are likewise coupled to U_Y3 over the cell D33. They are, however, damped twice and are therefore very weak. There is rather an inversely phased coupling over cell D43 here. If, in contrast, the differential input resistances are very low ohmic or virtually short circuited, as in a signal tapping circuit in accordance with FIG. 1, the described interference effects are substantially reduced. This observation only serves for illustration and is incomplete since there are a number of further coupling paths.

Figure 11:
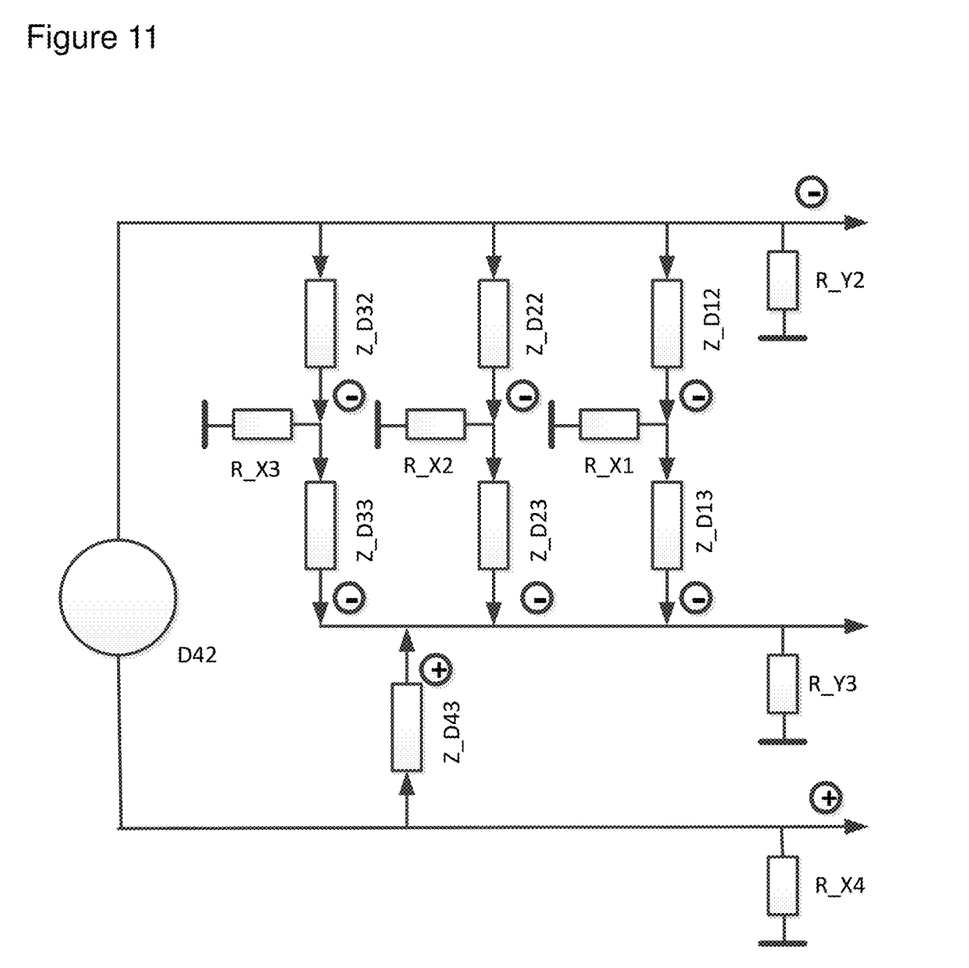
FIG. 11 a circuit detail of a matrix of avalanche photodiode elements for the further explanation of crosstalk effects.

FIG. 11 shows a circuit section for the triggering diode D42. The negative and positive pulses, shown by minus and plus signs in a circle here, are supplied from D42 to the resistor R_Y2 or R_X4. Major crosstalk terms for R_Y3 should now be looked at. The resistances of the individual avalanche photodiode elements are shown as complex resistances Z. The strongest crosstalk path runs inversely phased to the signal at R_Y2 over only the one resistor Z_D43. In addition, there are a number of parallel crosstalk paths over a respective two resistors in the longitudinal direction that deflect R_Y3 in the same phase as R_Y2. These crosstalk paths, however, include voltage splitters with Z_D12, Z_D22 or Z_D32 in the signal path and R_X1, R_X2 or R_X3 against ground and are thus much weaker. This again illustrates how advantageous resistances R_X and R_Y that are as small as possible are for a small crosstalk.

The invention claimed is:

1. A light receiver having a plurality of avalanche photodiode elements that are each biased by a bias above a breakdown voltage and that are thus operated in a Geiger mode to trigger a Geiger current on light reception, wherein the avalanche photodiode elements have a first connector and a second connector; wherein a first signal tapping circuit for reading out the avalanche photodiode elements is connected to one of the first and second connectors, and wherein a second signal tapping circuit for reading out the avalanche photodiode elements is connected to the other one of the first and second connectors
wherein at least one of the first signal tapping circuit and the second signal tapping circuit has an active coupling element, the active coupling element having an input that is connected to one of the first and second connectors and having an output; wherein the coupling element maps a Geiger current of the respective avalanche photodiode element at the input to a measured current corresponding in progression and level to the Geiger current in that the input for the Geiger current forms a virtual short circuit against a potential and the output is decoupled from the input.

2. The light receiver in accordance with claim 1, wherein the first connector is arranged on the anode side and the second connector is arranged on the cathode side of the respective avalanche photodiode element.

3. The light receiver in accordance with claim 1, wherein the avalanche photodiode elements are biased via the first connector and via the second connector.

4. The light receiver in accordance with claim 3, wherein a charge unit is respectively arranged between the avalanche photodiode element and the first connector or the second connector and the charge unit is bridged by a capacitor connected in parallel.

5. The light receiver in accordance with claim 1, wherein the avalanche photodiode elements have a third connector; with the first connector being configured for a capacitive decoupling of the Geiger current; and with the avalanche photodiode elements being biased via the second connector and the third connector.

6. The light receiver in accordance with claim 1, wherein the avalanche photodiode elements have a third connector and a fourth connector and a first charge unit is respectively arranged between the avalanche photodiode element and the third connector and a second charge unit is arranged between the avalanche photodiode element and the fourth connector; and wherein the avalanche photodiode elements are biased via the third connector and via the fourth connector.

7. The light receiver in accordance with claim 6, wherein the first charge unit is bridged to the first connector by a first capacitor connected in parallel and the second charge unit is bridged to the second connector by a second capacitor connected in parallel.

8. The light receiver in accordance with claim 1, wherein the avalanche photodiode elements form a matrix arrangement; wherein a plurality of first signal tapping circuits are each connected to the first connectors of the avalanche photodiode elements of a column and a plurality of second signal tapping circuits are each connected to the second connectors of the avalanche photodiode elements of a row.

9. The light receiver in accordance with claim 1, wherein the avalanche photodiode elements form a linear arrangement divisible into groups; wherein a plurality of first signal tapping circuits are each connected to the first connectors of the avalanche photodiode elements of a group and a plurality of second signal tapping circuits are each connected to the second connectors of an avalanche photodiode element from each group.

10. The light receiver in accordance with claim 1, wherein avalanche photodiode elements are connected in parallel and generate a common signal.

11. An optoelectronic sensor having at least one light receiver constructed according to claim 1,
wherein the sensor is configured for distance measurement in accordance with a time of flight process and/or is configured for data transmission.

12. A method for reading out the avalanche photodiode elements in the light receiver of claim 1, the method comprising:
reading the avalanche photodiodes by the first signal tapping circuit; and
reading the avalanche photodiode elements by the second signal tapping circuit.

13. The method in accordance with claim 12,
wherein an input of an active coupling element for the Geiger current in the first signal tapping circuit and/or in the second signal tapping circuit and connected to one of the first and seconds connectors is virtually short circuited against a potential such that the Geiger current flows into the coupling element practically without change and is mapped there onto a measurement current corresponding to the Geiger current in progression and level at an output of the coupling element, wherein the output is decoupled from the input.

14. The method in accordance with claim 12,
wherein the avalanche photodiode elements form a matrix arrangement and each avalanche photodiode element is read out, on the one hand, via a first signal tapping circuit associated with its column and, on the other hand, is read out via a second signal tapping circuit associated with its row.

15. A light receiver having a plurality of avalanche photodiode elements that are each biased by a bias above a breakdown voltage and that are thus operated in a Geiger mode to trigger a Geiger current on light reception, wherein the avalanche photodiode elements have a first connector and a second connector; wherein a first signal tapping circuit for reading out the avalanche photodiode elements is connected to one of the first and second connectors, and wherein a second signal tapping circuit for reading out the avalanche photodiode elements is connected to the other one of the first and second connectors, wherein the avalanche photodiode elements have a third connector; with the first connector being configured for a capacitive decoupling of the Geiger current; and with the avalanche photodiode elements being biased via the second connector and the third connector.

16. A light receiver having a plurality of avalanche photodiode elements that are each biased by a bias above a breakdown voltage and that are thus operated in a Geiger mode to trigger a Geiger current on light reception, wherein the avalanche photodiode elements have a first connector and a second connector; wherein a first signal tapping circuit for reading out the avalanche photodiode elements is connected to one of the first and second connectors, and wherein a second signal tapping circuit for reading out the avalanche photodiode elements is connected to the other one of the first and second connectors, wherein the avalanche photodiode elements have a third connector and a fourth connector and a first charge unit is respectively arranged between the avalanche photodiode element and the third connector and a second charge unit is arranged between the avalanche photodiode element and the fourth connector; and wherein the avalanche photodiode elements are biased via the third connector and via the fourth connector.

17. The light receiver in accordance with claim 16,
wherein the first charge unit is bridged to the first connector by a first capacitor connected in parallel and the second charge unit is bridged to the second connector by a second capacitor connected in parallel.

* * * * *